(12) United States Patent
Rhodes (10) Patent No.: US 7,345,330 B2
(45) Date of Patent: Mar. 18, 2008

(54) LOCAL INTERCONNECT STRUCTURE AND METHOD FOR A CMOS IMAGE SENSOR

(75) Inventor: Howard E. Rhodes, Boise, ID (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 125 days.

(21) Appl. No.: 11/007,859

(22) Filed: Dec. 9, 2004

(65) Prior Publication Data

US 2006/0125007 A1    Jun. 15, 2006

(51) Int. Cl.
*H01L 31/062* (2006.01)

(52) U.S. Cl. .......... 257/292; 257/291; 257/293

(58) Field of Classification Search ........ 257/231–234, 257/346, 291, 292, 293
See application file for complete search history.

(56) References Cited

U.S. PATENT DOCUMENTS

| | | | | |
|---|---|---|---|---|
| 5,206,532 A | * | 4/1993 | Roberts | 257/382 |
| 6,639,261 B2 | * | 10/2003 | Rhodes | 257/291 |
| 6,740,915 B1 | * | 5/2004 | Rhodes | 257/291 |
| 6,930,338 B2 | * | 8/2005 | Lee | 257/292 |
| 2003/0146456 A1 | * | 8/2003 | Hanson et al. | 257/213 |
| 2004/0217398 A1 | | 11/2004 | Lee | |

FOREIGN PATENT DOCUMENTS

EP        1 394 858        3/2004

OTHER PUBLICATIONS

European Search Report for European Patent application EP 05 25 7099, completed Mar. 21, 2006, 2 pages.

* cited by examiner

*Primary Examiner*—Douglas M. Menz
(74) *Attorney, Agent, or Firm*—Blakely Sokoloff Taylor & Zafman LLP (57) ABSTRACT

A self-aligned silicide (salicide) process is used to form a local interconnect for a CMOS image sensor consistent with a conventional CMOS image sensor process flow. An oxide layer is deposited over the pixel array of the image sensor. Portions of the oxide layer is removed and a metal layer is deposited. The metal layer is annealed to form a metal silicide. Optionally, a protective oxide layer is then deposited.

25 Claims, 10 Drawing Sheets

LOCAL INTERCONNECT STRUCTURE AND METHOD FOR A CMOS IMAGE SENSOR

TECHNICAL FIELD

The present invention relates to image sensors, and more particularly, to an image sensor that includes a local interconnect.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor. Thus, the number of pixels in the pixel array of the image sensor has significantly increased.

For example, five megapixel CMOS sensors are currently being manufactured today. This large array of pixels represents a significant amount of data to be gathered and read out. Additionally, the speed of acquisition and readout of the data is becoming an issue. The smaller and more complex pixels presents difficulties in routing all of the signal and power lines into and out of the pixel array, yet maintaining low cost and high performance. Complicating matters further, the "stack height" of the image sensor is also a factor. Image sensors benefit from low stack height which improves optical crosstalk and the ability of a microlens to effectively focus light onto the pixel-sensing area.

Thus, a method and structure for improving routing into and out of each individual pixel without increasing the stack height is desirable. Further, it would be advantageous if this structure could also be used in the peripheral regions (those regions of the image sensor outside of the pixel array) to improve speed, performance and size of the circuits formed in the peripheral regions.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
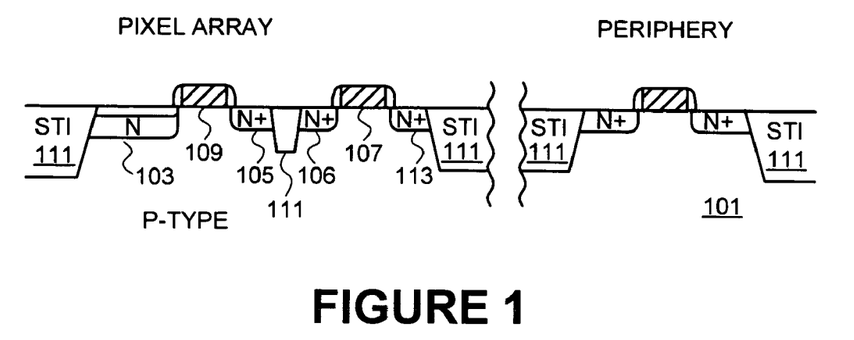
FIGS. 1-10 are cross-sectional views illustrating a method in accordance with the present invention for forming a local interconnect structure in a CMOS image sensor.

Turning to FIG. 1, a cross-sectional view of a representative CMOS image sensor is shown. The image sensor includes a pixel array section and a periphery section. While FIG. 1 (and the following figures) illustrates a cross-sectional view of a four transistor (4T) pixel design, the teachings and structures of the present invention can be equally applied to CMOS image sensors using 3T, 5T, 6T, 7T, or any other pixel design. For example, the present invention may be used in connection with pixels that include a reset transistor, a row select transistor, a global shutter transistor, a high dynamic range transistor, a transistor connected to a lateral overflow drain (lateral overflow transistor), or a transistor used to switch the floating diffusion (floating diffusion switch transistor).

In the 4T design shown in FIG. 1, the pixel array portion (showing a single pixel) includes a photosensor 103, a transfer transistor 109, a floating node 105, an n+ diffusion 106 connected to the $V_{dd}$ supply voltage (not shown), an amplification transistor 107 (in source-follower configuration), output node 113, and shallow trench isolation (STI) regions 111. The photosensor 103 may be a photodiode, a photogate, or a photoconductor.

Note that FIG. 1 only shows a portion of a 4T pixel and that other components (such as the reset transistor) are not shown for clarity purposes. The other components and operation of the pixel are not particularly germane to the present invention and are well known by those of ordinary skill in the art.

Similarly, in the periphery region, a single transistor is shown in cross section. This transistor is meant to be exemplary of the types of circuits and devices formed in the periphery. Thus, the transistor is merely representative of the types of devices existing in the periphery region.

As noted above, many of the gates of the transistors and the various N plus regions formed in the substrate must be interconnected with each other and the "outside world" in order to effectively operate and read out signal from the pixel. For example, although not shown in FIG. 1, in one embodiment, the photodiode 103 is reset to a reference voltage through a reset transistor. Additionally, the output node (n+ region) 113 is used to output the signal from the pixel, and thus, needs to be connected to a data routing interconnect structure. Because of these myriad connections, multiplied over millions of pixels, it is advantageous to form a local interconnect structure that will add little, if any, stack height. In accordance with the present invention, a local interconnect structure and method of making that structure is disclosed herein.

Figure 2:
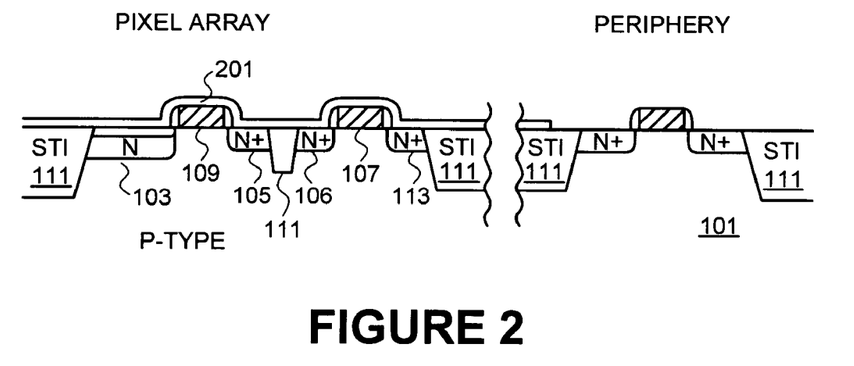

Specifically, turning to FIG. 2, in a first process step, an oxide layer 201 is blanket deposited onto the CMOS image sensor. The oxide layer 201 can be deposited using various deposition technologies, such as chemical vapor deposition (CVD), plasma enhanced chemical vapor deposition (PECVD), or high density plasma chemical vapor deposition (HDPCVD). After the formation of the oxide layer 201, a patterning and etching step is used to remove the oxide layer 201 from the periphery region. The result is shown in FIG. 2.

Figure 3:
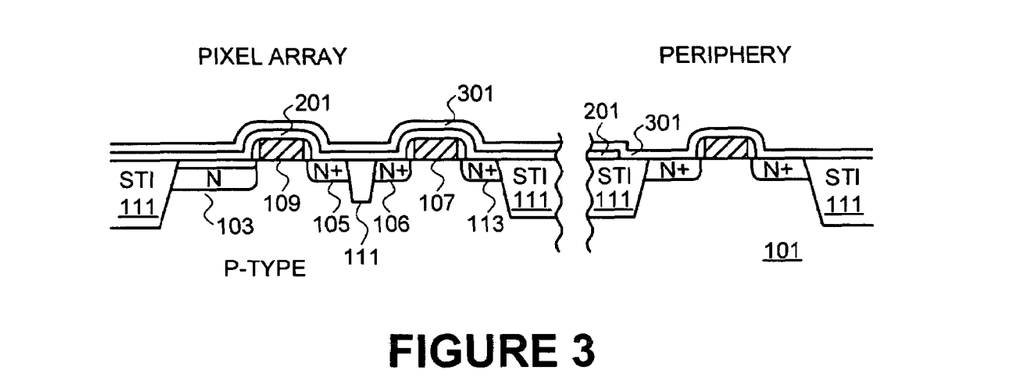

Next, a process, such as sputtering, is used to deposit a layer of metal over the image sensor. While the layer of metal can be any one of the types of metals used in semiconductor processing, such as tungsten, titanium, or molybdenum, in one embodiment, the metal is formed from cobalt. The metal layer is referred to in FIG. 3 as a cobalt layer 301. Note that because the protective oxide layer 201 has been removed in the periphery region, the cobalt layer 301 directly contacts the polysilicon gate of the transistor, as well as the source and drain regions of the transistor.

Figure 4:
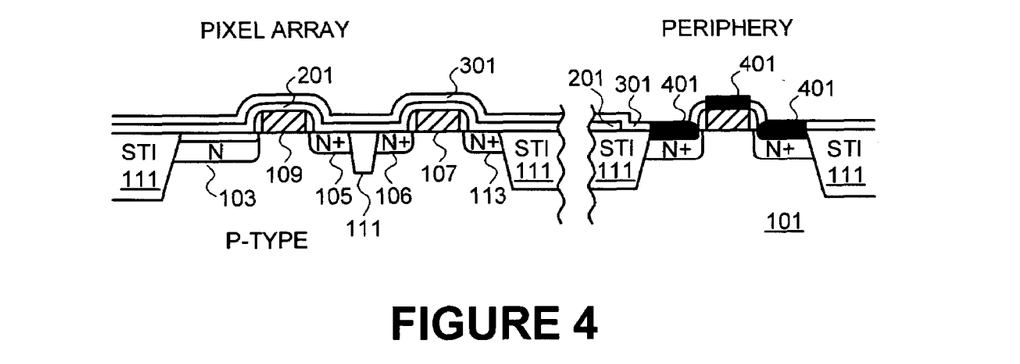

Turning to FIG. 4, a thermal anneal is performed to cause the cobalt layer 301 to interact with the silicon substrate in the periphery region and the polysilicon of the transistor gate. This results in the formation of a cobalt silicide 401 on those regions where the cobalt and silicon (or polysilicon) are in contact. The result is shown in FIG. 4.

Figure 5:
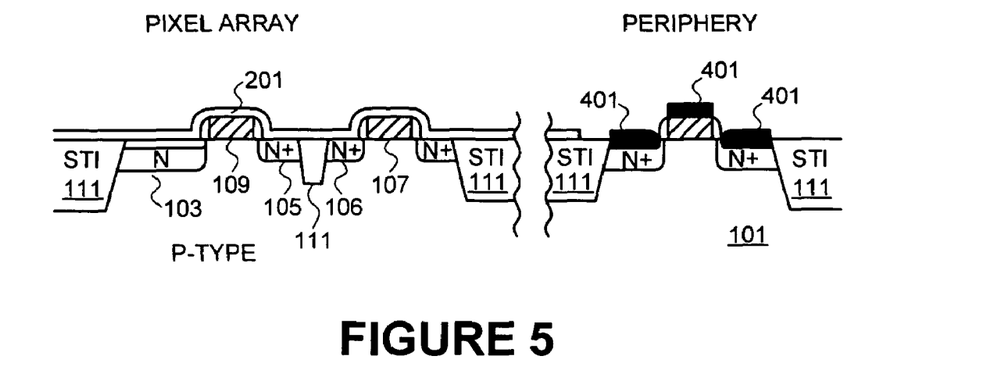

Next, turning to FIG. 5, the unreacted cobalt layer 301 is removed. This can be done, for example, using an appropriate wet etching technique. One example of such a wet etching would be $NH_4OH$ (ammonium hydroxide) in $H_2O_2$ (hydrogen peroxide).

Figure 6:
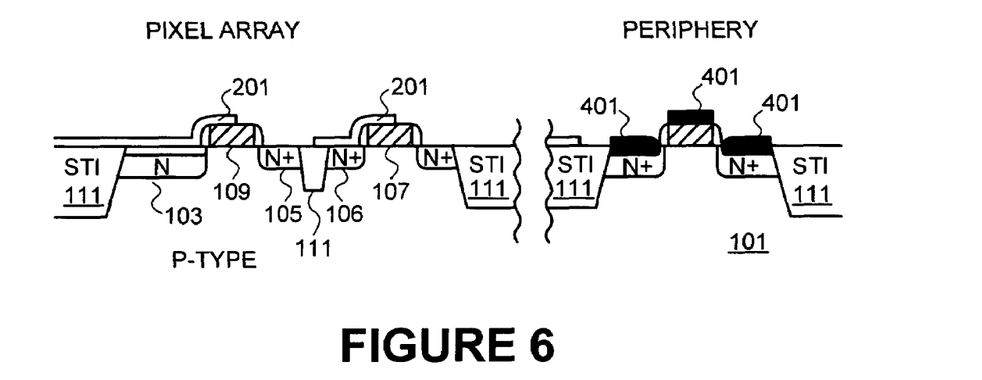

Next, as shown in FIG. 6, the oxide layer 201 is further patterned and etched to remove a portion of the oxide layer in the pixel array region. In one particular embodiment, the oxide layer 201 is removed from the amplification transistor 107, the floating node 105, the output node 113, and a portion of the gate of the transfer transistor 109. However, it can be appreciated that the teachings of the present invention can be applied such that the particular pattern used may vary with various design parameters. In other words, for other pixel designs that require differing local interconnections, the patterning of the oxide layer 201 may be different. In the embodiment of a 4T transistor pixel, where an amplification transistor 107 is configured as a source-follower, the pattern of oxide layer 201 as shown in FIG. 6 is appropriate.

Figure 7:
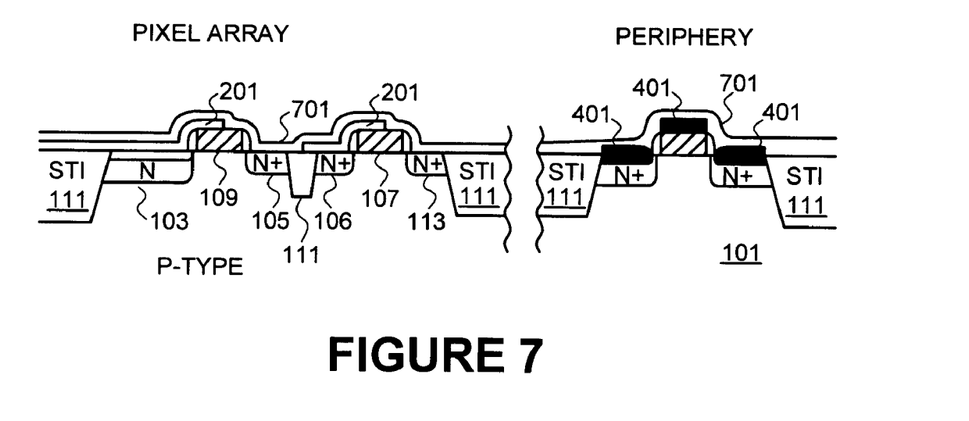
Figure 8:
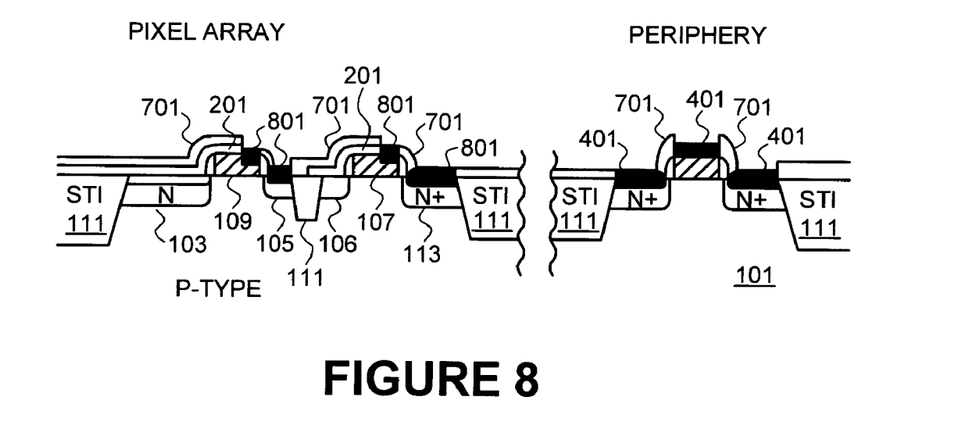

Following the patterning and etching of the oxide layer 201, as seen in FIG. 7, a second metal layer 701 is blanket deposited over the image sensor. Again, the second metal layer may be any metal, but in one embodiment, the second metal layer is a second cobalt layer 701. Following the deposition of the second cobalt layer 701, another thermal anneal is used to form cobalt silicide on those regions where cobalt and silicon (or polysilicon) are in contact. Thus, as seen in FIG. 8, cobalt silicide regions 801 are formed over the floating node 105, over a portion of the gate of the transfer transistor 109, over a portion of the gate of the amplification transistor 107, and over the output node 113.

Figure 9:
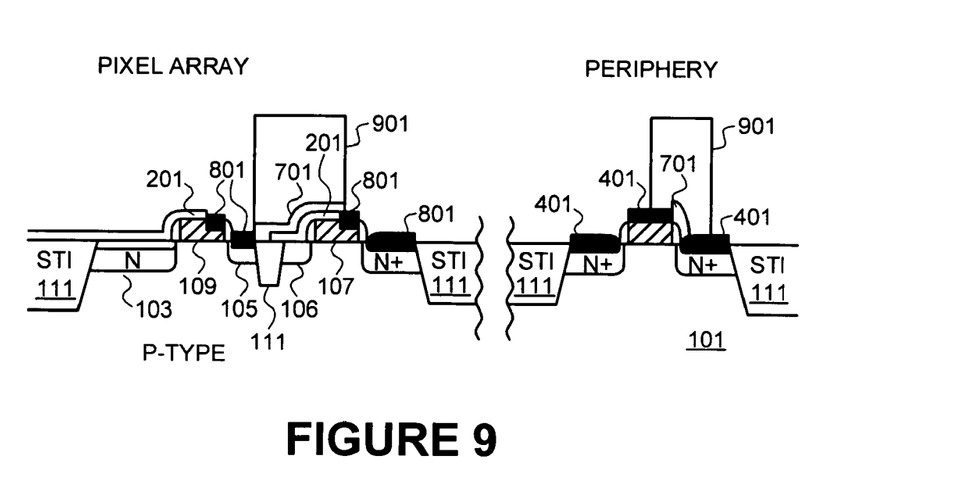

Next, turning to FIG. 9, a patterning and etching step is performed using a photoresist 901 to remove any unreacted cobalt from the second cobalt layer 701. Note once again that the precise patterning used to remove the unreacted cobalt may be variable depending upon the design of the pixels and the periphery region. Thus, the pattern shown in FIG. 9 of the photoresist 901 is merely one possible embodiment of the present invention. Specifically, because a 4T pixel design must electrically connect the floating node 105 to the gate of the amplification transistor 107, the portion of cobalt layer 701 that connects the gate of the amplification transistor 107 to the floating node 105 is protected by the photoresist 901 and not removed. This can best be accomplished by the photoresist pattern shown in FIG. 9. However, it can be appreciated that for different applications, different photoresist patterns may be necessary. Similarly, in the periphery region, the photoresist pattern is merely one possible example.

Figure 10:
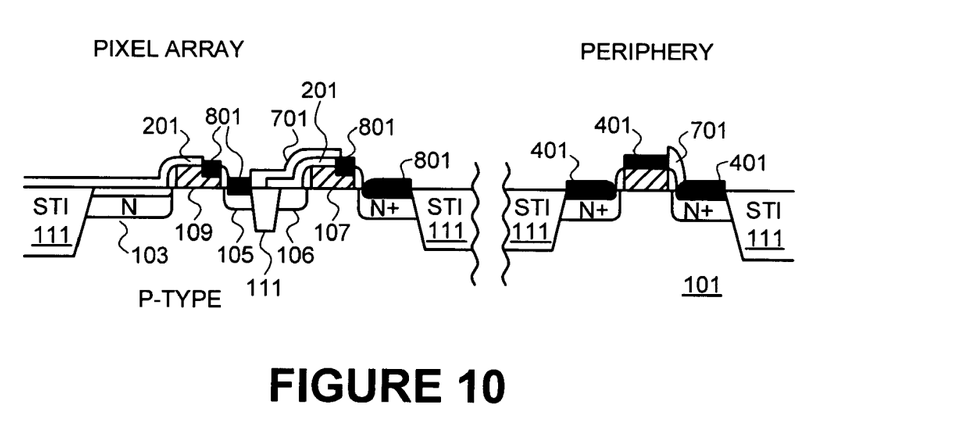

Finally, after removing the photoresist 901, local interconnect structures 701 are formed. It is important to note that this local interconnect structure 701 does not add appreciably to the stack height since it is "hugging" the sidewall spacers of the gates of their respective transistors. Moreover, a cobalt silicide 801 and 401 is formed advantageously during the same process. This will allow better electrical connection to other interconnect and/or routing structures.

Figure 11:
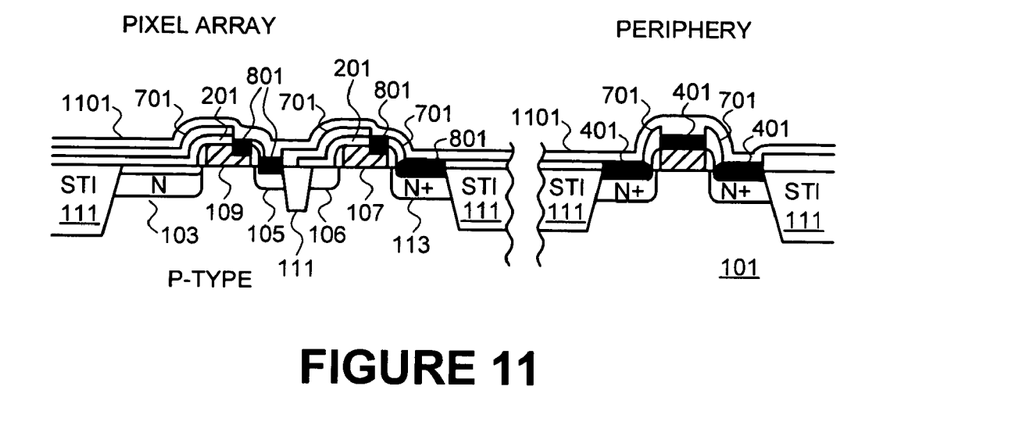
FIGS. 11-13 are cross-sectional views illustrating an alternative method in accordance with the present invention for forming a local interconnect structure in a CMOS image sensor.
Figure 12:
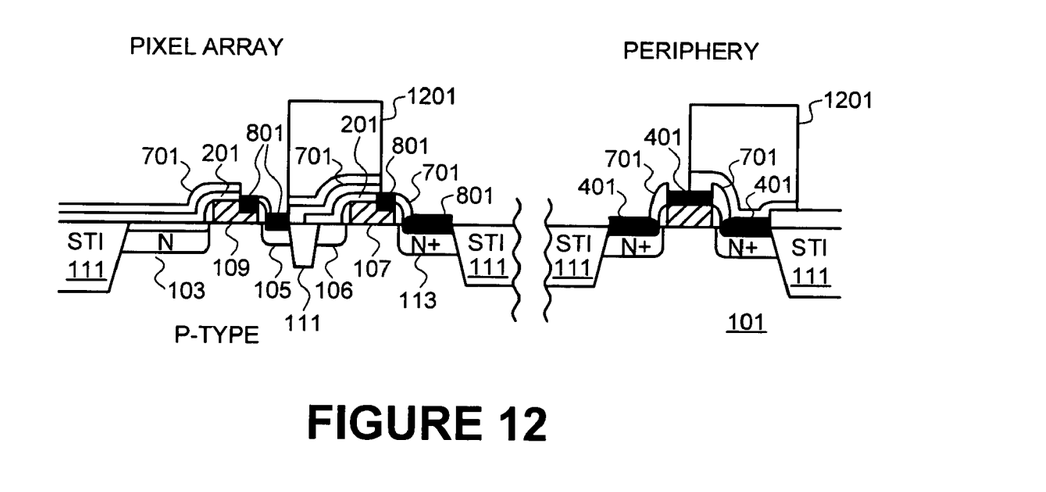
Figure 13:
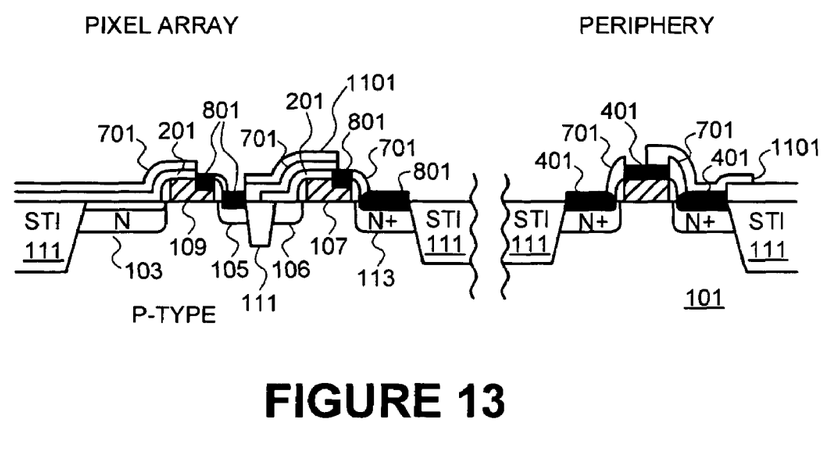
Figure 14:
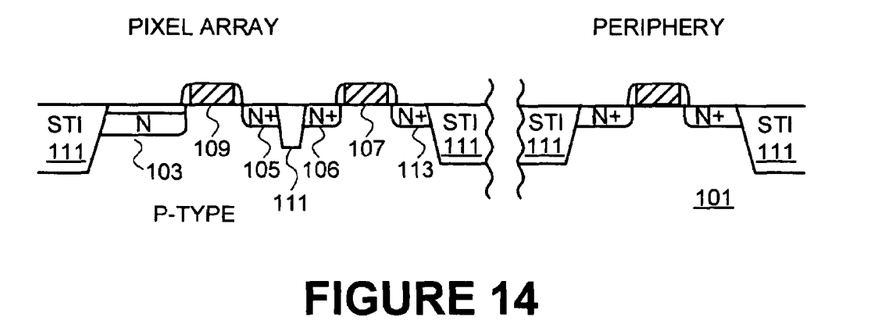
FIGS. 14-19 are cross-sectional views illustrating another alternative method in accordance with the present invention for forming a local interconnect structure in a CMOS image sensor.
Figure 15:
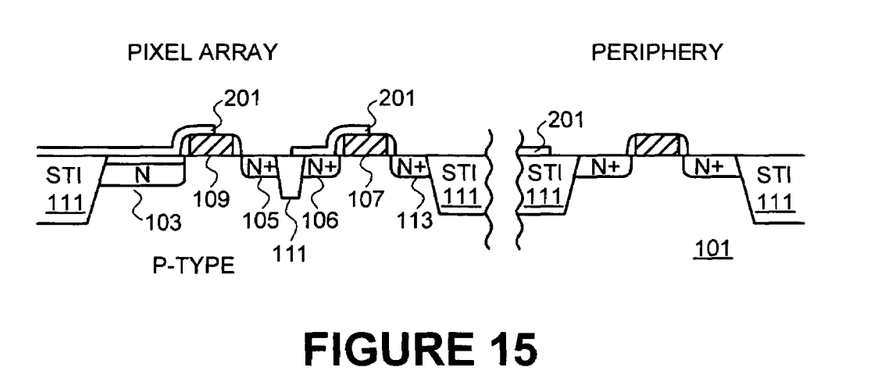

An alternative embodiment of the present invention can be seen in FIGS. 11-13. In this embodiment, the process is the same as FIGS. 2-8. Starting from the structure shown in FIG. 8, a second insulator (in one embodiment oxide) layer 1101 is blanket deposited over the CMOS image sensor. Next, a photoresist is deposited and patterned to produce the photoresist sections 1201. The second oxide layer 1101 is then removed using the photoresist blocks 1201 to preserve the second oxide layer 1101 that is over the local interconnect structures 701. Finally, the photoresist blocks 1201 are removed. Note that in this embodiment, an additional protective insulator layer 1101 is formed that protects the local interconnect structure 701. The protective insulator layer 1101 may be for example, silicon oxide, silicon dioxide, silicon nitride, or a multilayered insulator stack composed of these.

As can be seen by the above description and Figures, a self-aligned silicide (salicide) process is disclosed that forms a local interconnect consistent with a conventional CMOS image sensor process flow. As noted previously, it may be possible to use other types of metal, or even alloys of metal, in substitution for the cobalt. For example, titanium/tungsten, titanium/molybdenum, cobalt/tungsten, or cobalt/molybdenum may be used.

Note that there is a two-step metal deposition process for the present invention: (1) a first metal deposition for forming the cobalt silicide contact regions on the substrate and on the tops of the transistor gates, and (2) a second metal deposition is used to form the local interconnect on the sidewalls of the transistor gates. This dual metal stack approach is used to help prevent agglomeration of the metal during subsequent high temperature thermal anneal steps.

In this particular pixel design, the local interconnect can be used to provide the connection between the floating diffusion 105 and the amplification transistor 107. This is a substantial advantage in array routing, especially in pixel designs where two isolated floating diffusions may need to be connected. Further, this local interconnect also provides a helpful link to provide a route underneath a first metal layer.

Another advantage is that the local interconnect is optically opaque. In the pixel array region, it can be used as a buried light block layer to improve optical crosstalk. In dark reference pixels typically used in a pixel array, the metal layer can be placed over the photodiode and act as a light block for the dark reference pixels. This is an advantage because it now allows for a third metal layer to be used as routing, such as for $V_{out}$ in the active array and in the dark reference pixels, rather than requiring the third metal layer to be used as the light block layer for the dark reference pixels. In the periphery region, a local interconnect is gained that can be used to improve logic-packing density and help further shrink the periphery circuits.

Figure 16:
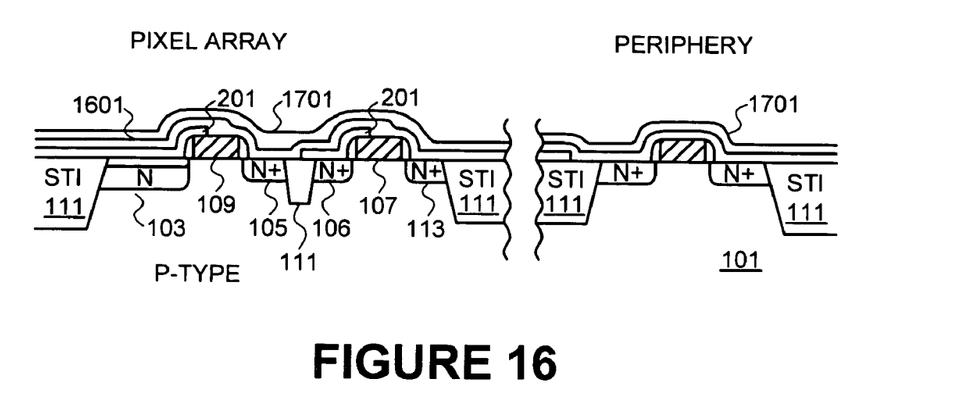

In another alternative embodiment shown in FIGS. 14-19, the double metal deposition process described above may be avoided. Specifically, turning to FIG. 14, a similar structure as that shown in FIG. 1 is provided. Then, an oxide layer 201 is deposited and etched with the pattern shown in FIG. 15. Then, as seen in FIG. 16, a layer of cobalt 1601 is blanket deposited over the wafer. The cobalt layer 1601 is then followed by a blanket deposition of another metal based layer, such as a titanium nitride (TiN) layer 1701.

Figure 17:
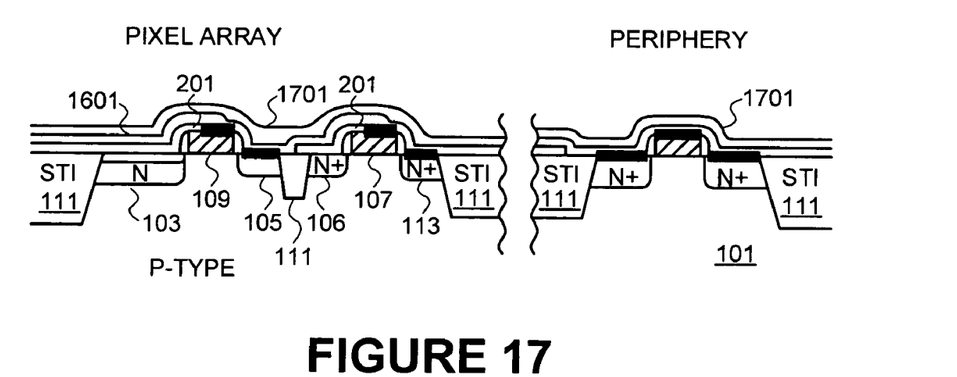

Next, turning to FIG. 17, a thermal anneal is performed to cause the cobalt layer 1601 to interact with the exposed silicon substrate and the exposed polysilicon. This results in the formation of a cobalt silicide on those regions where the cobalt and silicon (or polysilicon) are in contact.

Figure 18:
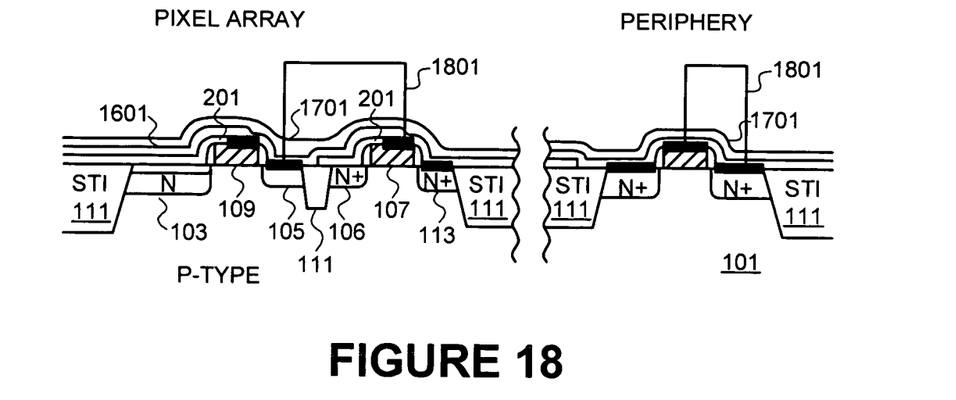
Figure 19:
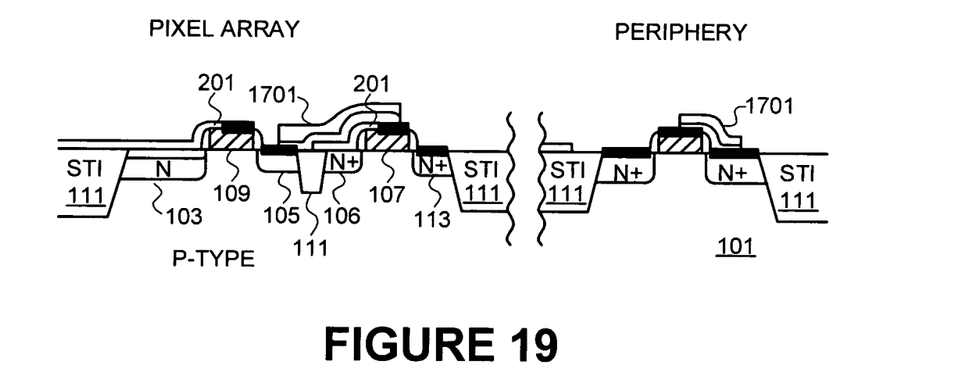

Turning to FIG. 18, a photoresist layer 1801 is deposited and patterned. As noted above, this is one possible pattern and the present invention may be used in connection with a myriad of other patterns. Then, at FIG. 19, the unprotected portions of the cobalt layer 1601 and titanium nitride layer 1701 is removed by means of, for example, a wet etch. The result is a local interconnect structure that is along the sidewalls of a transistor. In the particular embodiment shown in FIG. 19, note that the gate of the amplification (source-follower) transistor 107 is electrically connected by the local interconnect to the floating node 105.

From the foregoing, it will be appreciated that specific embodiments of the invention have been described herein for purposes of illustration, but that various modifications may be made without deviating from the spirit and scope of the invention. For example, the local interconnect structure may be formed from a multilayered metal stack that includes a metal/metal nitride combination. Further, local interconnect structure may be used to connect a plurality of pixels together and act as a "global interconnect" where the interconnect connects, for example, all reset transistors in a row of pixels together to a row driver diffusion that resides outside the array. Other examples are using the local interconnect to link the transfer gates in a row or all the row select transistors in a row. This type of global interconnect could also extend to connecting diffusion regions together. For example, all of the $V_{dd}$ supply voltages could be connected in the array together to an outside $V_{dd}$ supply line. In another example, one could connect all the output signal diffusions ($V_{out}$) in a column to a column sense circuit or amplifier. Accordingly, the invention is not limited except as by the appended claims.

I claim:

1. An active pixel comprising:
a photosensor formed in a semiconductor substrate;
a transfer transistor formed between said photosensor and a floating node and selectively operative to transfer a signal from said photosensor to said floating node;
an amplification transistor controlled by said floating node, said amplification transistor having an amplification gate and a diffusion region;
a local interconnect structure electrically connecting said floating node to said amplification gate, said local interconnect structure being formed at least partially on top of said amplification gate and at least partially conforming to a sidewall of said amplification gate; and
a patterned insulator layer formed between said local interconnect structure and said diffusion region of the amplification transistor and at least partially conforming to the sidewall of the amplification gate, the patterned insulator layer to electrically isolate said local interconnect structure from said diffusion region.

2. The pixel of claim 1 wherein said photosensor has a P+ pinning layer on the surface of said semiconductor substrate.

3. The pixel of claim 1 further wherein local interconnect structure is formed by a self-aligned silicide process.

4. The pixel of claim 3 wherein said local interconnect structure is formed from a cobalt silicide.

5. The pixel of claim 3 wherein said local interconnect structure is formed from titanium, tungsten, cobalt, molybdenum, nickel, or tantalum, and alloys thereof.

6. The pixel of claim 1 wherein said local interconnect structure is formed contemporaneously in a periphery region and further such that said local interconnect structure in said periphery region is a self aligned silicide.

7. The pixel of claim 1 further including a protective insulator layer formed over said local interconnect structure.

8. The pixel of claim 7 wherein the protective insulator layer is formed from silicon oxide, silicon dioxide, silicon nitride, or a multilayered insulator stack.

9. The pixel of claim 1 wherein said pixel is integrated into a CMOS image sensor.

10. The pixel of claim 1 wherein said pixel is a 4T, 5T, 6T, or 7T pixel.

11. The pixel of claim 1 wherein said photosensor is a photodiode, photogate, or a photoconductor.

12. The pixel of claim 1 further including a reset transistor, a row select transistor, a global shutter transistor, a high dynamic range transistor, a lateral overflow transistor, or floating diffusion switch transistor.

13. The pixel of claim 1 wherein said local interconnect structure is formed from a multilayered metal stack that includes a metal/metal nitride combination.

14. The pixel of claim 1, wherein the diffusion region is an N+ diffusion region.

15. The pixel of claim 1, wherein the diffusion region is a source region of the amplification transistor.

16. The pixel of claim 1, wherein the patterned insulator layer is an oxide layer.

17. The pixel of claim 1, wherein the patterned insulator layer is further formed between at least a partial portion of the top of said amplification gate and the local interconnect structure.

18. An active pixel comprising:
a diffusion area formed in a substrate;
a transistor spaced apart from the diffusion area by an isolation region, the transistor having transistor gate with a side spacer, the transistor further having an N+ diffusion region;
an interconnect structure electrically connecting the diffusion area to the transistor gate, the interconnect structure being at least partially on top of the transistor gate and generally conforming to a sidewall of the transistor gate; and
a patterned insulator layer formed between said interconnect structure and said N+ diffusion region of the transistor and at least partially conforming to the sidewall of the transistor gate, the patterned insulator layer to electrically isolate said interconnect structure from said N+ diffusion region.

19. The pixel of claim 18, further comprising a first metal silicide layer on top of the diffusion area and a second metal silicide layer at least partially on top of the transistor gate, wherein the interconnect electrically connects the first and second metal silicide layers.

20. The pixel of claim 18, further comprising a silicon oxide layer generally conforming to the sidewall of the transistor gate and disposed between the interconnect structure and the transistor gate.

21. The pixel of claim 18, wherein the interconnect structure is formed from a material selected from a group consisting of titanium, tungsten, cobalt, molybdenum, nickel, and tantalum.

22. The pixel of claim 18, further comprising a protective insulator layer formed on top of the interconnect structure.

23. The pixel of claim 22 wherein the protective insulator layer is formed from a material selected from a group consisting of silicon oxide, silicon dioxide, and silicon nitride.

24. The pixel of claim 18 wherein the interconnect structure includes a multilayered metal stack.

25. A CMOS image sensor incorporating the pixel of claim 18.

* * * * *